United States Patent
Yun et al.

(10) Patent No.: US 8,809,104 B2
(45) Date of Patent: Aug. 19, 2014

(54) DYE-SENSITIZED SOLAR CELL AND METHOD OF FABRICATING THE SAME

(71) Applicant: Electronics and Telecommunications Research Institute, Daejeon (KR)

(72) Inventors: Ho-Gyeong Yun, Seoul (KR); Yong-Seok Jun, Daejeon (KR); Man-Gu Kang, Daejeon (KR); Seung-Yup Lee, Gyeongsangbuk-do (KR); Hunkyun Pak, Daejeon (KR); Jong-Hyeok Park, Daejeon (KR); Jong-Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/870,046

(22) Filed: Apr. 25, 2013

(65) Prior Publication Data
US 2013/0237006 A1 Sep. 12, 2013

Related U.S. Application Data

(62) Division of application No. 12/118,557, filed on May 9, 2008, now abandoned.

(30) Foreign Application Priority Data

Oct. 16, 2007 (KR) .................. 10-2007-0104023

(51) Int. Cl.
*H01L 31/18* (2006.01)
(52) U.S. Cl.
USPC ........................................... 438/85
(58) Field of Classification Search
USPC .............................................. 438/85
See application file for complete search history.

(56) References Cited

U.S. PATENT DOCUMENTS

| | | | |
|---|---|---|---|
| 4,927,721 A | 5/1990 | Gratzel et al. | |
| 6,946,597 B2 * | 9/2005 | Sager et al. | 136/263 |
| 7,045,205 B1 | 5/2006 | Sager | |
| 2005/0098204 A1 | 5/2005 | Roscheisen et al. | |
| 2005/0121068 A1 | 6/2005 | Sager et al. | |
| 2007/0095390 A1 | 5/2007 | Ahn et al. | |

FOREIGN PATENT DOCUMENTS

| | | |
|---|---|---|
| JP | 2002-110260 A | 4/2002 |
| JP | 2002-170557 A | 6/2002 |
| JP | 2003-317815 A | 11/2003 |
| KR | 10-2006-0074233 | 7/2006 |

* cited by examiner

*Primary Examiner* — Robert Carpenter
(74) *Attorney, Agent, or Firm* — Rabin & Berdo, P.C.

(57) ABSTRACT

Provided are a dye-sensitized solar cell and a method of fabricating the same. The dye-sensitized solar cell includes an electrode structure including a conductive layer having pores that are regularly arranged, a semiconductor oxide layer disposed on a surface of the conductive layer, and a dye layer disposed on a surface of the semiconductor oxide layer.

14 Claims, 4 Drawing Sheets

DYE-SENSITIZED SOLAR CELL AND METHOD OF FABRICATING THE SAME

CROSS-REFERENCE TO RELATED APPLICATIONS

This is a divisional of co-pending U.S. application Ser. No. 12/118,557, filed May 9, 2008. This U.S. non-provisional patent application claims priority under 35 U.S.C. §119 of Korean Patent Application No. 10-2007-104023, filed on Oct. 16, 2007, the entire contents of which are hereby incorporated by reference.

BACKGROUND OF THE INVENTION

The present invention disclosed herein relates to a dye-sensitized solar cell and a method of fabricating the same, and more particularly, to a dye-sensitized solar cell including an electrode structure having a conductor with pores regularly formed, which is fabricated by the use of a template, and a method of fabricating the dye-sensitized solar cell.

The present invention has been derived from research undertaken as a part of IT R & D program of the Ministry of Information and Communication and Institution of Information Technology Association (MIC/IITA) [2006-S-006-02], Components/Module technology for ubiquitous terminals.

A dye-sensitized solar cell includes a dye molecule capable of receiving incident light with a visible wavelength to form electron-hole pairs, a semiconductor oxide capable of receiving excited electrons, and an electrolyte reacting with the electrons after working and returning to the solar cell, which significantly differs from a compound solar cell or a wafer type silicon solar cell using p-n junction.

A dye-sensitized solar cell, which has been well known hitherto, was published by Michael Gratzel et al. (refer to U.S. Pat. No. 4,927,721). A photoelectrochemical solar cell published by Michael Gratzel et al. includes a photosensitive dye molecule capable of absorbing a visible light to generate electron-hole pairs, an electrode structure which is a semiconductor oxide formed of nanoparticle titanium oxide ($TiO_2$) with dye molecules adsorbed, an opposite electrode coated with platinum (Pt) or carbon (C), and an electrolyte filled between the semiconductor oxide and the opposite electrode. Because such the photoelectrochemical solar cell can be fabricated with low fabrication cost per electrical power in comparison with the wafer type silicon solar cell that utilizes a p-n junction, so the photoelectrochemical solar cell is being in the limelight recently.

FIG. 1 is a partial sectional view illustrating a flow of electrons created by sunlight in a conventional dye-sensitized solar cell.

Referring to FIG. 1, dye molecules excited by light emitted from the sun eject electrons (e−) into a conduction band of a semiconductor oxide layer 20 formed of nanoparticle titanium oxide. The electrons ejected into the conduction band pass through the nanoparticle titanium oxide and arrive at a conductive substrate 10 formed of a glass coated with fluorine doped $SnO_2$ (FTO). Thereafter, the electrons are transferred to an external circuit (not shown). The electrons, which come back after performing an electrical work in the external circuit, are injected into the semiconductor oxide layer 20 formed of nanoparticle semiconductor oxide through an opposite electrode (not shown), e.g., platinum or carbon electrode, by means of the electron transfer function of an oxidation/reduction electrolyte 30. Finally, the electrons reduce the dye molecule 24 deficient in electrons. In this manner, the conventional dye-sensitized solar cell is operated.

However, before the electrons injected into the semiconductor oxide layer 20 made of nanoparticle titanium oxide from the dye molecule 24 are transferred to the external circuit and perform an electrical work therein, some of the electrons injected into the conduction band stay in an unoccupied surface energy level of the semiconductor oxide layer 20 on which the dye molecule 24 is not adsorbed while passing through the semiconductor oxide layer 20 and the conductive substrate 10. At this time the electron and the electrolyte 30 are recombined so that the electrons do not circulate in a circuit but vanished ineffectively. Accordingly, there is a loss in photovoltaic energy conversion efficiency.

Furthermore, in the dye-sensitized solar cell proposed by Michael Gratzel et al. where the semiconductor oxide layer is used as the electrode structure, a moving passage through which the electrons injected from the dye molecules to the semiconductor oxide layer move to the conductive substrate is also made of the nanoparticle titanium oxide. Accordingly, the electron encounters a strong electrical resistance while the electron moves to a 3-dimensional structured semiconductor oxide layer, leading to a decrease in short-circuit current density (Jsc). Resultingly, since the photovoltaic energy conversion efficiency is determined by multiplication of a current, a voltage and a fill factor of the solar cell, the current, the voltage and the fill factor should be improved to increase the photovoltaic energy conversion efficiency. Particularly, to increase the voltage significantly, there is a method of increasing the electron density of the nanoparticle semiconductor oxide by minimizing the recombination with the electrons.

Example of a conventional method of minimizing the decrease of the photovoltaic energy conversion efficiency occurring in the semiconductor oxide, e.g., the titanium oxide, is as followings. In the conventional method, the semiconductor oxide formed of the titanium oxide is used as the electrode structure, and coated with a semiconductor oxide material having high band gap energy, for example, niobium oxide ($Nb_2O_5$) to form an energy barrier between the semiconductor oxide layer and the electrolyte, thus preventing the recombination. According to the conventional method, the photovoltaic energy conversion efficiency was somewhat enhanced. However, because the titanium oxide is basically used as a material for the electrode structure, there is a limitation in electron movement. Therefore, an increase in the photovoltaic energy conversion efficiency was limited. Adsorptive properties of the dye molecule on the niobium oxide are poorer than that of the dye molecule on the titanium oxide.

As another conventional method, there has been an attempt to employ a nanowire-shaped semiconductor oxide as the electrode structure. However, unlike the expectation that the nanowire-shaped semiconductor oxide could increase the photovoltaic energy conversion efficiency because the nanowire itself is a single crystal and thus advantageous for electron diffusion, the electrode structure made of nanowire-, nanorod- and nanotube-shaped semiconductor oxide exhibits poorer photovoltaic energy conversion efficiency compared to the case of using the nanoparticle semiconductor oxide as the electrode structure. Possibly, this is ascribed to the fact that the electrode structure made of the nanowire-, nanorod- and nanotube-shaped semiconductor oxide has a smaller surface area than the nanoparticle semiconductor oxide. In addition to the aforesaid conventional methods, there have been attempts to form the electrode structure using a semiconductor oxide of zinc oxide (ZnO) or tin oxide instead of the titanium oxide. However, the solar cell achieved by this conventional method still exhibits a poorer photovoltaic energy conversion efficiency compared to the solar cell using the titanium oxide for the electrode structure.

SUMMARY OF THE INVENTION

The present invention provides a dye-sensitized solar cell capable of maximizing photovoltaic energy conversion efficiency.

The present invention also provides a method of fabricating a dye-sensitized solar cell capable of maximizing photovoltaic energy conversion efficiency.

Embodiments of the present invention provide dye-sensitized solar cells including: an electrode structure including a conductive layer including pores which are regularly arranged; a semiconductor oxide layer disposed on a surface of the conductive layer; and a dye layer disposed on a surface of the semiconductor oxide layer.

In some embodiments, the conductive layer includes at least one selected from the group consisting of tin oxide, indium doped tin oxide, antimony doped tin oxide, fluorine doped tin oxide, metal, conductive polymer and a nano carbon material.

In other embodiments, the semiconductor oxide layer includes at least one selected from the group consisting of zinc oxide, tin oxide and titanium oxide.

In still other embodiments, the dye-sensitized solar cells further include: a bottom electrode structure disposed one side of the electrode structure, and contacting the electrode structure; a top electrode structure disposed on the other side of the electrode structure; and an electrolyte layer interposed between the electrode structure and the top electrode structure, and filling the pores.

In even other embodiments, the dye-sensitized solar cells further include a catalyst layer interposed between the electrode structure and the electrolyte layer. Herein, the catalyst layer includes platinum or carbon.

In yet other embodiments, the electrolyte has one state of liquid, solid and gel.

In further embodiments of the present invention, methods of fabricating a dye-sensitized solar cell include: forming an electrode structure including: preparing a template having pores that are regularly arranged; forming a conductive layer on a surface of the template; forming a semiconductor oxide layer on a surface of the conductive layer; and forming a dye layer on a surface of the semiconductor oxide layer.

In still further embodiments, the methods further include removing the template.

In even further embodiments, the template is formed of at least one material selected from the group consisting of polystyrene, poly methyl methacrylate (PMMA) and block co-polymer. Here, the template is burn out and removed during a thermal treatment of forming the electrode structure.

In yet further embodiments, the template is formed of alumina. In this case, the template is removed after formation of the electrode structure.

In other embodiments, the conductive layer is formed of at least one selected from the group consisting of tin oxide, indium doped tin oxide, antimony doped tin oxide, fluorine doped tin oxide, metal, conductive polymer and a nano carbon material.

In still other embodiments, the forming of the semiconductor oxide layer is performed using at least one method selected from the group consisting of a deep coating method, an electrophoretic method, and an electroplating method.

In even other embodiments, the forming of the semiconductor oxide layer includes anodizing or thermally oxidizing a metal or a metal precursor.

In yet other embodiments, the semiconductor oxide layer includes at least one selected from the group consisting of zinc oxide, tin oxide and titanium oxide.

According to the present invention, a dye-sensitized solar cell includes an electrode structure having pores regularly arranged, thus making it possible to minimize the recombination due to oxidation/reduction reaction occurring at a boundary between the electrode structure and an electrolyte. Furthermore, it is possible to minimize a moving passage of an electron in the electrode structure. Consequently, the dye-sensitized solar cell can maximize its photovoltaic energy conversion efficiency.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
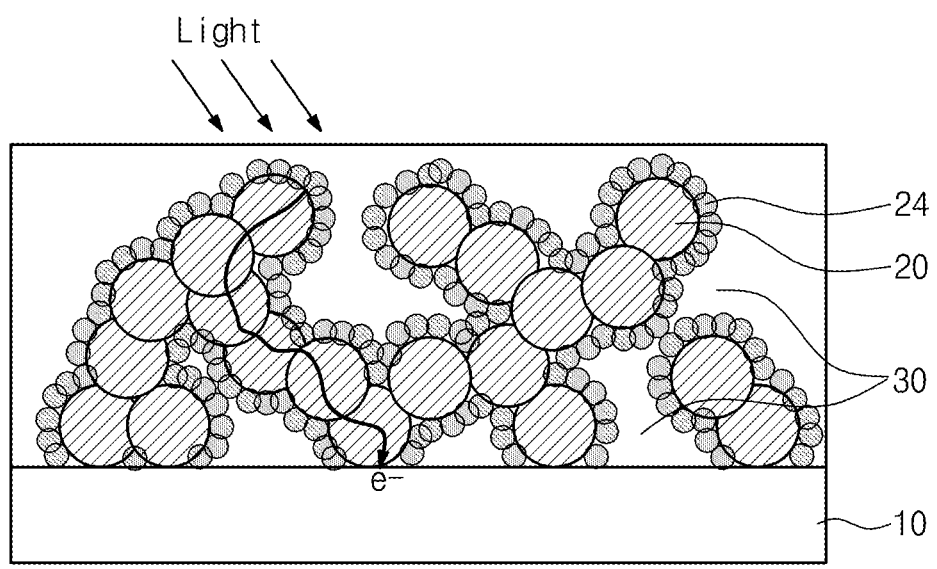
FIG. 1 is a partial sectional view illustrating a flow of electrons created by sunlight in a conventional dye-sensitized solar cell.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, an exemplary embodiment of the present invention will be described with the accompanying drawings.

Figure 2:
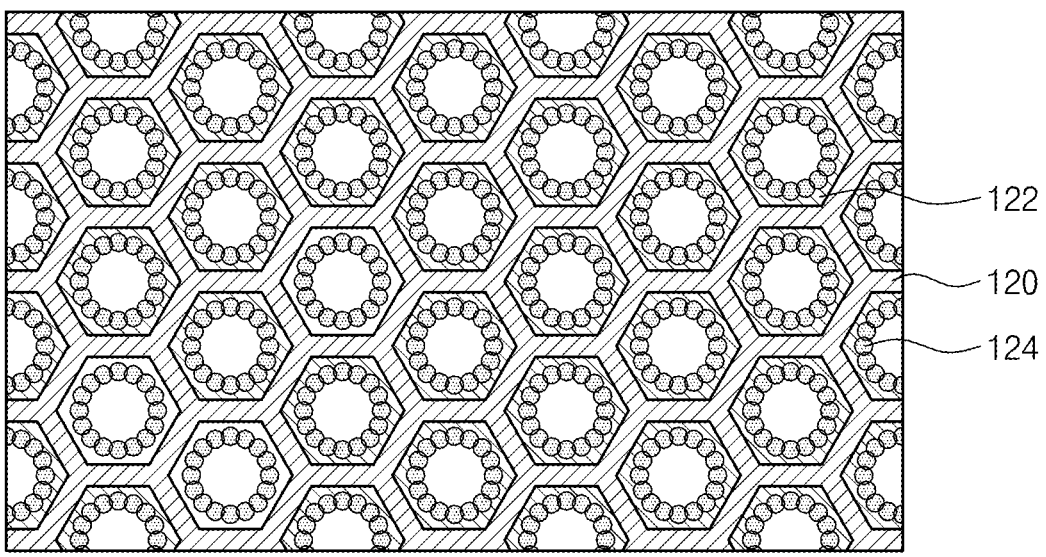
FIG. 2 is a plan view illustrating an electrode structure of a dye-sensitized solar cell and a method of fabricating the same according to an embodiment of the present invention.

FIG. 2 is a plan view illustrating an electrode structure of a dye-sensitized solar cell and a method of fabricating the same according to an embodiment of the present invention.

Referring to FIG. 2, the electrode structure of the dye-sensitized solar cell may include a conductive layer 120, a semiconductor oxide layer 122 and a dye layer 124.

The conductive layer 120 may have pores that are regularly arranged. The conductive layer 120 may be formed by coating a surface of a template (not shown) having pores regularly arranged with a transparent and conductive material. The conductive material contained in the conductive layer 120 may include at least one material selected from the group consisting of tin oxide ($SnO_2$), indium doped tin oxide (ITO), antimony doped tin oxide (ATO), fluorine doped tin oxide (FTO), metal, conductive polymer and a nano carbon material. Preferably, the conductive layer 120 may be formed of tin oxide.

The template used to form the conductive layer 120 having pores regularly arranged may have a shape that allows a surface area of the electrode structure to be maximized, for example, a honeycomb, nanowire, nanorod, or nanotube shape. The template may include at least one material selected from the group consisting of polystyrene, poly methyl methacrylate (PMMA), block co-polymer and alumina.

The semiconductor oxide layer 122 may be formed on a surface of the conductive layer 120. The semiconductor oxide layer 122 may be formed using one method selected from the group consisting of a deep coating method, an electrophoretic method, and an electroplating method. In addition, the semiconductor oxide layer 122 may be formed by anodizing or thermally oxidizing a metal or a metal precursor. The semiconductor oxide layer 122 may include at least one selected from the group consisting of zinc oxide, tin oxide and titanium oxide. Preferably, the semiconductor oxide layer 122 may include titanium oxide.

The dye layer 124 may be formed on a surface of the semiconductor oxide layer 122. The dye layer 124 may be formed by adsorbing dye molecules on the semiconductor oxide layer 122. Accordingly, it is possible to form the electrode structure having pores regularly arranged.

In the case of using an organic-based template such as polystyrene, PMMA and block co-polymer, the template may be burn out and removed during a thermal treatment process of forming the electrode structure. In contrast, in the case of using an inorganic-based template such as alumina, the template may be removed after the formation of the electrode structure. This is because the inorganic-based template is not sintered during the thermal process of forming the electrode structure.

The conductive layer 120 has regularly arranged pores and thus high porosity, which may make it easy to thickly coat the surface of the conductive layer 120 with the semiconductor oxide layer 122. Because the conductive layer 120 is spaced apart from the semiconductor oxide layer 122 by merely several nanometers, the thickness of the electrode structure may be increased up to a distance that light can reach. As the thickness of the electrode structure becomes greater, the short-circuit current density becomes higher. That is, the semiconductor oxide layer 122 may serve as an energy barrier prohibiting the recombination of electrons and holes between the electrolyte 130 and the conductive layer 120. Therefore, the photovoltaic energy conversion efficiency of the dye-sensitized solar cell can be remarkably increased.

The electrode structure of the dye-sensitized solar cell having the above-described structure has regularly arranged pores, thus minimizing the recombination due to oxidation/reduction reaction occurring at a boundary between the electrode structure and the electrolyte. Moreover, the moving passage of electrons can be minimized in the electrode structure.

Figure 3:
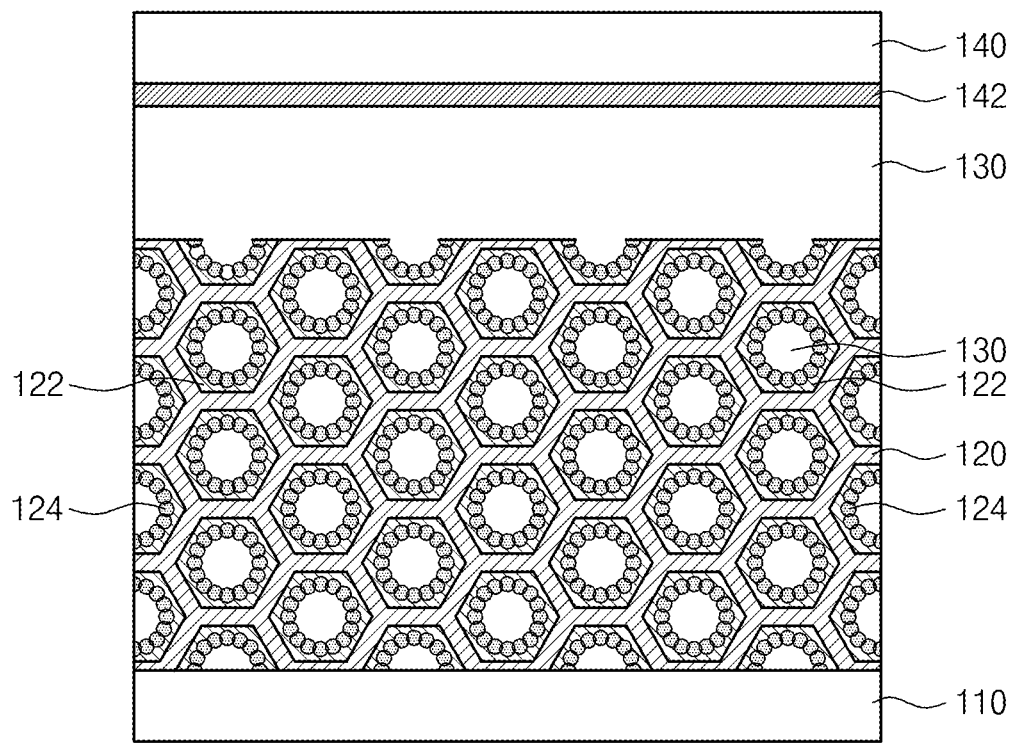
FIG. 3 is a sectional view illustrating a dye-sensitized solar cell and a method of fabricating the same according to an embodiment of the present invention.

FIG. 3 is a sectional view illustrating a dye-sensitized solar cell and a method of fabricating the same according to an embodiment of the present invention.

Referring to FIG. 3, a dye-sensitized solar cell may include a bottom electrode structure 110, an electrode structure having a conductive layer 120, a semiconductor oxide layer 122 and a dye layer 124, an electrolyte layer 130 and a top electrode structure 140.

The bottom electrode structure 110 may include a transparent substrate with conductivity or a transparent substrate of which one side is coated with a conductive material. The electrode structure may be formed to contact the conductive side of the bottom electrode structure 110.

The electrolyte layer 130 is interposed between the electrode structure and the top electrode structure 140, and fills the pores of the electrode structure. The electrolyte layer 130 has one state of liquid, solid and gel. Preferably, the electrolyte layer 130 may include $I_3^-/I^-$-based electrolyte.

The top electrode structure 140 may include a transparent substrate with conductivity or a transparent substrate of which one side is coated with conductive material. The conductive one side of the top electrode structure 140 may be formed to contact the electrolyte layer 130. The dye-sensitized solar cell may further include a catalyst layer 142 interposed between the electrolyte 130 and the top electrode structure 140. The catalyst layer 142 may include platinum or carbon. Accordingly, it may be possible to form the dye-sensitized solar cell including the electrode structure having the pores regularly arranged.

Because the dye-sensitized solar cell includes the electrode structure having the pores regularly arranged, thus making it possible to minimize the recombination due to oxidation/reduction reaction occurring at a boundary between the electrode structure and the electrolyte. Furthermore, it may be possible to minimize a moving passage of an electron in the electrode structure.

Figure 4:
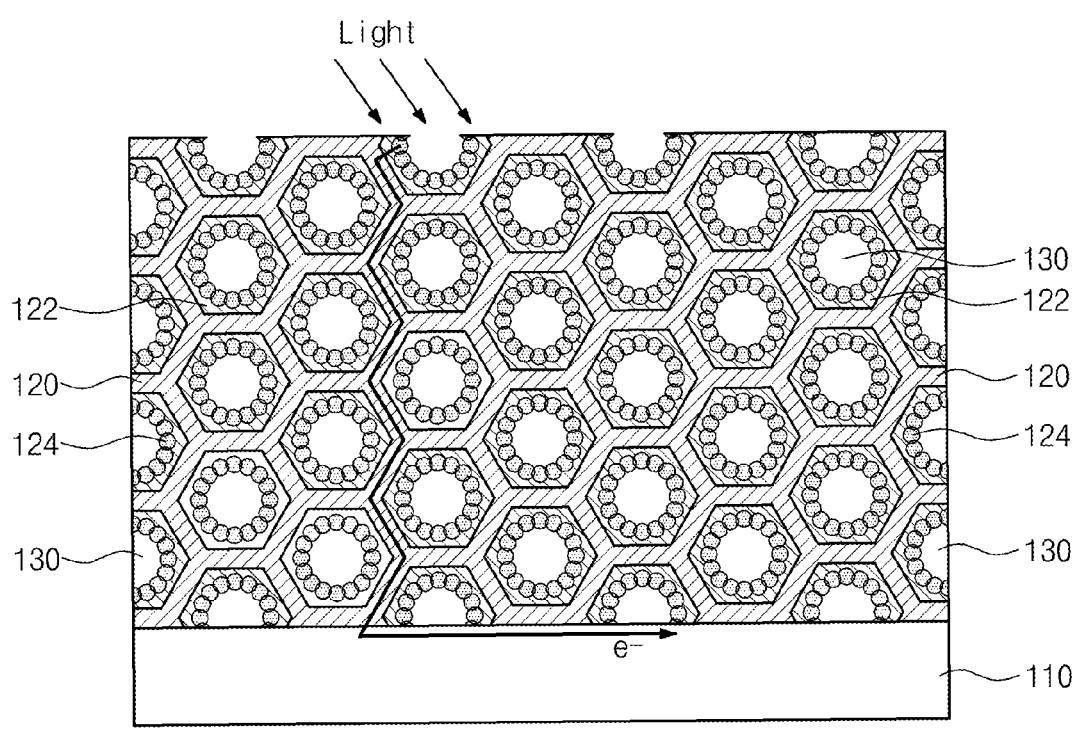
FIG. 4 is a partial sectional view illustrating a flow of electrons created by sunlight in the dye-sensitized solar cell according to the embodiment of the present invention.

FIG. 4 is a partial sectional view illustrating a flow of an electron created by sunlight in the dye-sensitized solar cell according to the embodiment of the present invention.

Referring to FIG. 4, because electrons (e−) transferred from the dye layer 124 to the conductive layer 120 move to the bottom electrode structure 110 through the honeycombed conductive layer 120 in the electrode structure of the dye-sensitized solar cell, the moving passage of the electrons may be minimized to a length of several nanometers to several tens of nanometers. The semiconductor oxide layer 122 between the dye layer 124 and the conductive layer 120 may serve as an energy barrier prohibiting the electrons transferred to the conductive layer 120 from reacting with the electrolyte layer 130 again. Consequently, the photovoltaic energy conversion efficiency may be maximized.

As described above, according to the present invention, a dye-sensitized solar cell includes an electrode structure having pores regularly arranged, thus making it possible to minimize the recombination due to oxidation/reduction reaction occurring at a boundary between the electrode structure and an electrolyte. Furthermore, it is possible to minimize a moving passage of an electron in the electrode structure. Consequently, the dye-sensitized solar cell can maximize its photovoltaic energy conversion efficiency.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a dye-sensitized solar cell, the method comprising:
forming an electrode structure including:
preparing a template having template pores that are regularly arranged;
forming a conductive layer on a surface of the template to have a plurality of pores;
forming a semiconductor oxide layer on a surface of the conductive layer, wherein each of said plurality of pores is partially filled by the semiconductor oxide layer collectively to form a plurality of first spaces each of which is disposed within each of said plurality of pores; and
forming a dye layer on a surface of the semiconductor oxide layer,
wherein each of the first spaces is partially filled by the dye layer collectively to form a plurality of second spaces, and all of two adjacent ones of the plurality of second spaces are apart from each other such that the dye layer, the semiconductor oxide layer, the conductive layer, the semiconductor oxide layer, and the dye layer intervene therebetween in this order.

2. The method of claim 1, further comprising removing the template.

3. The method of claim 2, wherein the template is formed of at least one material selected from the group consisting of polystyrene, poly methyl methacrylate (PMMA) and block co-polymer.

4. The method of claim 3, wherein the template is burn out and removed during a thermal treatment of forming the electrode structure.

5. The method of claim 2, wherein the template is formed of alumina.

6. The method of claim 1, wherein the conductive layer is formed of at least one selected from the group consisting of tin oxide, indium doped tin oxide, antimony doped tin oxide, fluorine doped tin oxide, metal, conductive polymer and a nano carbon material.

7. The method of claim 1, wherein the forming of the semiconductor oxide layer is performed using at least one method selected from the group consisting of a deep coating method, an electrophoretic method, and an electroplating method.

8. The method of claim 7, wherein the semiconductor oxide layer comprises at least one selected from the group consisting of zinc oxide, tin oxide and titanium oxide.

9. The method of claim 1, wherein the forming of the semiconductor oxide layer comprises anodizing or thermally oxidizing a metal or a metal precursor.

10. The method of claim 9, wherein the semiconductor oxide layer comprises at least one selected from the group consisting of zinc oxide, tin oxide and titanium oxide.

11. A method of fabricating a dye-sensitized solar cell, the method comprising:
forming an electrode structure including:
forming a conductive layer including a plurality of pores;
forming a plurality of units, each of which is disposed in each of the plurality of pores, by partially filling each of the plurality of pores with a semiconductor oxide layer and a dye layer, leaving in each of the plurality of pores an empty space surrounded by the dye layer, such that each of the plurality of units includes the semiconductor oxide layer, the dye layer within the semiconductor oxide, and the empty space surrounded by the dye layer, which are concentrically disposed, and each of the plurality of units is separated from and spaced apart from an adjacent one of the plurality of units with the conductive layer intervening therebetween.

12. A method of fabricating a dye-sensitized solar cell, the method comprising:
forming a bottom electrode structure;
forming an electrode structure on the bottom electrode, including sub-steps of:
forming a conductive layer including a plurality of pores, and
forming a plurality of units, each of which is disposed in each of the plurality of pores, by partially filling each of the plurality of pores with a semiconductor oxide layer and a dye layer, leaving in each of the plurality of pores an empty space surrounded by the dye layer, such that each of the plurality of units includes the semiconductor oxide layer, the dye layer within the semiconductor oxide, and the empty space surrounded by the dye layer, and each of the plurality of units is separated from and spaced apart from an adjacent one of the plurality of units with the conductive layer intervening therebetween;
forming a top electrode structure over the electrode structure; and
forming an electrolyte layer to fill the empty space of each of the plurality of units and to be interposed between the top electrode structure and said electrode structure.

13. The method of claim 12, further comprising forming a catalyst layer interposed between the electrolyte layer and the top electrode structure, such that the electrolyte layer comes in direct contact with the catalyst layer.

14. The method of claim 12, wherein the electrolyte layer comes in direct contact with the top electrode structure.

* * * * *